United States Patent [19]

Wen

[11] Patent Number: 5,191,509
[45] Date of Patent: Mar. 2, 1993

[54] TEXTURED POLYSILICON STACKED TRENCH CAPACITOR

[75] Inventor: Duen-Shun Wen, Crompond, N.Y.

[73] Assignee: International Business Machines Corporation, Armonk, N.Y.

[21] Appl. No.: 806,080

[22] Filed: Dec. 11, 1991

[51] Int. Cl.$^5$ .................... H01G 4/06; H01L 29/92
[52] U.S. Cl. ............................. 361/311; 257/304; 257/309; 437/49; 437/203
[58] Field of Search ........................... 361/311–313; 357/51, 23.6; 437/52

[56] References Cited

PUBLICATIONS

"A Capacitor-Over-Bit-Line (COB) Cell with a Hemispherical-Grain Storage Node for 64 Mb Drams" by Sakao et al., pp. 27.3.1 through 27.3.4.
"Rugged Surface Poly-Si Electrode and Low Temperature Deposited SI$_3$N$_4$ for 64-Megabyte and Beyond STC Dram Cell" by Yoshimaru et al., pp. 27.4.1 through 27.4.4.
"Electrical Characterization of Textured Interpoly Capacitors for Advanced Stacked Drams" by Fazan et al., pp. 27.5.1 through 27.5.3.

Primary Examiner—Donald A. Griffin
Attorney, Agent, or Firm—Whitham & Marhoefer

[57] ABSTRACT

A trench capacitor structure suitable for inclusion in integrated circuit devices and method for forming the same provides increased electrode surface area and capacitance by means of a textured surface of one of the capacitor electrodes. The textured surface is achieved by differentially etching grain boundaries of a doped polysilicon layer or by direct deposition of hemispherical grain polysilicon to form the electrode. Additional capacitance and contact area can be obtained by additional etching of the trench bottom prior to electrode deposition and dielectric growth.

23 Claims, 2 Drawing Sheets

TEXTURED POLYSILICON STACKED TRENCH CAPACITOR

BACKGROUND OF THE INVENTION

1. Field of the Invention

This invention relates to capacitors and, more particularly, to capacitors suitable for inclusion in integrated circuits such as dynamic memories.

2. Description of the Prior Art

The great increase in computing power of computers of all types in recent years has necessitated an increase in the amount of memory which can be rapidly accessed by a central processing unit. This, in turn, has led to a continuing interest in providing greater amounts of storage on a single chip and the reduction of the size of memory cells.

Memory technology may be considered as divided into two types, each of which has some advantages relative to the other for certain requirements of any computing system. Static memories generally rely on a bistable active circuit for the storage of individual bits of data. Static memory cells generally have a substantial number of active devices, such as transistors and are relatively large, limiting the number of memory cells which may be formed on a single chip. Nevertheless, the storage provided is stable and no refresh of data is required. Therefore, the memory can be accessed at any time, enhancing the extremely fast read or write time of this type of memory.

In contrast, dynamic memories require far fewer electronic components in each memory cell and far greater numbers of cells may be placed on a single chip. However, unlike the stable data storage provided by static memories, in dynamic memories, data is typically stored as charge on a capacitor within the storage cell. The capacitors are subject to leakage and, therefore, the charge must be periodically refreshed or rewritten to avoid corruption of data.

Perhaps the largest component of a dynamic memory cell is the capacitor in which charge is stored. Since the primary virtue of dynamic memories is the possibility of reducing memory cell size to increase the number of memory cells which can be formed on a single chip, there has been much interest in reducing the "footprint" or area of the substrate or chip required for formation of each capacitor. Much of the effort, in this regard, has focussed on the improvement of sense amplifier structures to reduce the amount of charge which must be stored, at a relatively low voltage, in each capacitor. At the present state of the art, data can often be reliably stored by storing perhaps only a few dozen electrons in each capacitor. Storage of such small amounts of charge makes charge leakage of each capacitor particularly critical since each electron lost to capacitor leakage represents a correspondingly larger portion of the voltage which must be detected by sense amplifiers in the memory.

Such improvements in sense amplifier structures has been accompanied by numerous capacitor designs to reduce the "footprint" of the capacitor on the chip. So-called trench capacitors which are formed vertically within the semiconductor substrate have been a particularly significant development in this regard. However, the depth within the substrate to which trench capacitors may be reliably extended is limited and further reductions in capacitor "footprint" area are, at the present state of the art, usually accompanied by reduction of the charge storage capacity of each capacitor.

As process complexity has increased in an effort to increase trench depth in order to increase the ratio of charge storage capacity to chip area required for a capacitor, manufacturing yields have been adversely affected, further increasing production costs. At the same time, such complexity and miniaturization has tended to increase the resistance of contacts to the capacitor structure, reducing access speed, operational reliability and noise margins. These same increases in process complexity have also led to problems of increased susceptibility to charge leakage which, as pointed out above, is particularly critical at extreme integration densities and the small amounts of charge which may be stored at low voltages.

Further, as an incident of memory design, the minimum charge storage capacity of each memory capacitor must be kept at least comparable to the parasitic capacitance of wiring connections on the chip which are required to provide access to each cell. Thus, as dynamic memory designs have sought to exceed 256 megabytes, requiring relatively long bit and word lines, it has been difficult to reconcile the competing design requirements of reduction of capacitor "footprint" area with the need to maintain a charge storage capacity which will allow reasonable refresh rates and adequate operating margins relative to parasitic capacitance of chip wiring necessary to access such large numbers of memory cells.

SUMMARY OF THE INVENTION

It is therefore an object of the present invention to provide a capacitor structure having an enhanced charge storage capacity for predetermined overall dimensions of the capacitor.

It is another object of the invention to provide a capacitor structure which allows low resistance connections to be made thereto at high integration densities.

It is a further object of the invention to provide a capacitor structure which can be produced with reduced process complexity to provide improved manufacturing yields.

It is yet another object of the invention to provide a capacitor structure with reduced charge leakage.

In order to achieve the above and other objects of the invention, a capacitor structure is provided including an electrode having a textured surface formed within an inner surface of a trench.

In accordance with another aspect of the invention, a capacitor is provided which is formed by a method including a step of forming an electrode of the capacitor within a trench such that the electrode has a textured surface.

In accordance with a further aspect of the invention, a method of forming a capacitor is provided including a step of forming an electrode of the capacitor within a trench such that the electrode has a textured surface.

In accordance with yet another aspect of the invention, a trench capacitor is provided having an electrode formed of directly deposited hemispherical grain polysilicon.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 3:
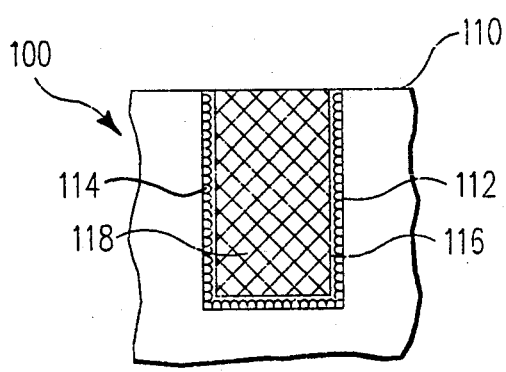

Referring now to the drawings, and more particularly to FIG. 3, there is shown a basic form of a capacitor 100 according to the invention. The capacitor is formed in a trench 112 preferably formed in a substrate 110. The inner surface of the trench 112 is lined with a textured, doped polysilicon layer 114. The capacitor dielectric 116 is sandwiched between the textured polysilicon layer 114 and doped polysilicon fill 118. Contacts are made to the capacitor at the textured polysilicon layer 114, preferably through the substrate, and at polysilicon fill 118.

While the structure of the capacitor according to the invention is generally similar to that of other trench capacitors known in the art, the invention is distinguished therefrom by the use of textured polysilicon to increase the area of the capacitor, thus increasing the capacitance thereof. It is to be understood that developing a textured surface of the polysilicon can be done in numerous ways such as etching and deposition of polysilicon in a manner which results in particular grain structures such as hemispherical grain (HSG), as will be described in greater detail below. The term "textured" polysilicon, as used herein is to be understood as generic to silicon layers which undulate in a manner such that the surface area is significantly increased, including layers which are "roughened" by grain boundary etching and direct deposition of polysilicon having a hemispherical grain structure.

As is well-understood in the art, the capacitance of a capacitor is directly proportional to the product of the dielectric constant of the capacitor dielectric and the area of the capacitor and inversely proportional to the electrode separation or thickness of the capacitor dielectric. Thus, by increasing the area of the capacitor by providing a textured surface on a polysilicon layer forming one of the capacitor electrodes, the capacitance of the capacitor is increased. In accordance with the invention, this increase in capacitance may be exploited in several ways such as reducing trench depth, which, in turn, simplifies the manufacturing process and increases manufacturing yields, increasing dielectric thickness to reduce leakage (e.g. by phenomena such as Storage Trench Anomalous Breakdown, a gate-induced leakage at a parasitic transistor formed at the trench sidewall when insulating oxides are very thin), increasing breakdown voltage to improve performance of the capacitor and also tending to increase manufacturing yields or a combination of these effects with or without an increase in the amount of charge stored at a given voltage to reduce refresh frequencies. Since the area of the capacitor may be increased by a factor of 2 to 2.5 by virtue of the use of textured polysilicon, a substantial improvement in capacitor performance may be simultaneously obtained in all of these areas of interest to memory performance.

Figure 1:
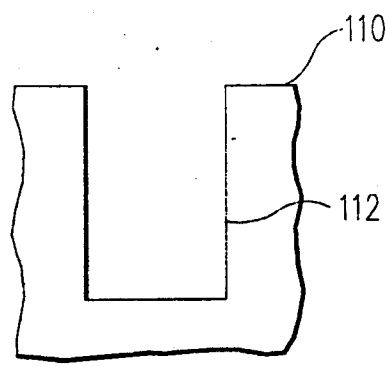
FIGS. 1, 2 and 3 illustrate stages of construction of the basic form of the capacitor according to the invention.
Figure 2:
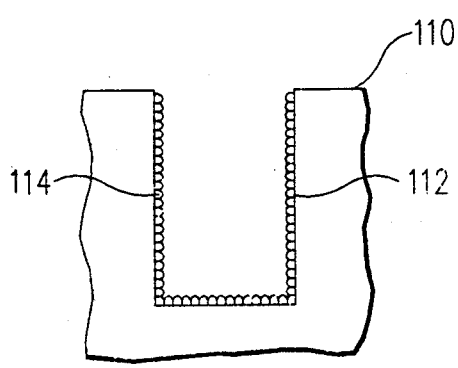

With reference now to FIGS. 1-3, the construction of the basic invention will now be described. FIG. 1 shows a cross-section of a portion of a p+ or n+ doped semiconductor substrate 110 with a trench 112 formed therein, preferably by etching. The doping of the semiconductor substrate is preferably determined by the nature of the connection to be made to the capacitor. For instance, a relatively heavy doping is required to produce relatively high conductivity of the substrate if a connection to the capacitor is to be made through the substrate. If desired, a sacrificial oxide layer (not shown) may be grown in the trench and then etched away to improve the final quality of the etched surface inside the trench.

Referring now to FIG. 2, a thin layer 114 of p+ or n+ doped polysilicon is then deposited over the entirety of the interior of the trench. This deposition can be a conventional polysilicon layer deposited at temperatures of approximately 700° C. or HSG polysilicon can be directly deposited at a temperature of about 500° C. If conventional polysilicon is deposited to form layer 114, the deposition of the layer is followed by wet oxidation, for example, water vapor at 900° C., and oxide etching, for example, with hydrogen fluoride, to completely remove this oxide. Since oxidation occurs more rapidly at grain boundaries, etching away of the differentially oxidized material causes a roughened surface to be developed on the polysilicon layer.

After forming a polysilicon layer 114 with a textured surface, a capacitor dielectric layer 116 is deposited over the polysilicon and the remainder of the trench is filled with doped polysilicon fill 118 by any suitable deposition technique, as shown in FIG. 3. While any known capacitor dielectric may be provided, a so-called ONO (oxide-nitride-oxide) layered dielectric structure is preferred. This dielectric is preferably formed by thermally growing an oxide, for example at 800° C. in an oxygen atmosphere followed by a nitride deposition. The further oxide layer is then grown by oxidizing the nitride layer, again, preferably at 800° C. in an oxygen atmosphere. The device or substrate is then planarized and appropriate connections (not shown) may be applied in any desired manner.

As indicated above, electrical connection to the textured polysilicon layer 114 is preferably made through the substrate, in which case, a patterned insulator layer would be required after planarization to insulate connection to the polysilicon fill from the substrate. It should also be noted that if connection to textured polysilicon layer 114 is made through the substrate, the contact area is very large and contact resistance is minimized, improving the speed at which the capacitor 100 may be charged and discharged.

Figure 11:
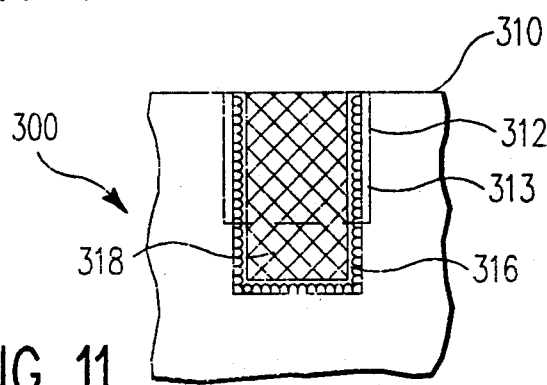

Referring now to FIGS. 4-7, a preferred embodiment of the invention will now be described. The completed capacitor 200 of FIG. 7 differs from capacitor 100 of FIG. 3 by the inclusion of an isolation oxide layer 213 which is necessary at high integration densities. Essentially, this isolation oxide surrounding each capacitor, together with the substrate connection of a plurality of capacitors formed on the substrate form a series connection of capacitances and reduces parasitic capacitive coupling between the trench capacitors. In the interest of clarity of description of this embodiment and the alternative capacitor embodiment 300 of FIG. 11, the last two digits of reference numerals applied to corresponding structures have been maintained throughout all of the Figures.

Figure 4:
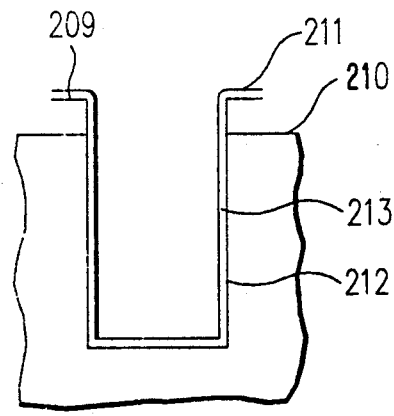
FIGS. 4, 5, 6 and 7 illustrate stages of construction of a preferred form of the capacitor according to the invention.
Figure 5:
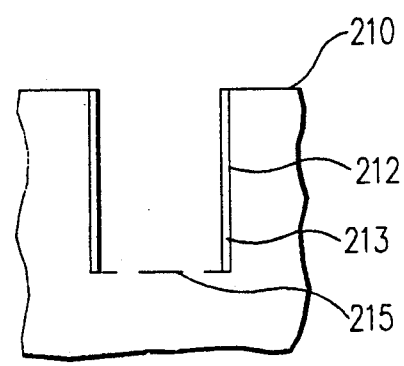

As in FIG. 1, FIG. 4 shows a cross-section of substrate portion 210 with trench 212 formed therein.

Again, the trench is preferably formed by etching in accordance with mask 209 which was not included in FIG. 1. As with the embodiment of FIG. 3, a sacrificial oxide layer may be grown and etched to improve trench surface quality. An isolation insulator such as silicon oxide 211 is deposited on the mask 210 on the surface of the substrate and on the walls and bottom of the trench. The isolation layer 211 and mask 210 is then removed from the substrate surface and the bottom of the trench is opened leaving isolation insulator 213 in place, preferably by reactive ion etching in the vertical direction, as indicated by dashed line 215 of FIG. 5 in order to form a connection to the substrate when textured layer 214 is formed.

Figure 6:
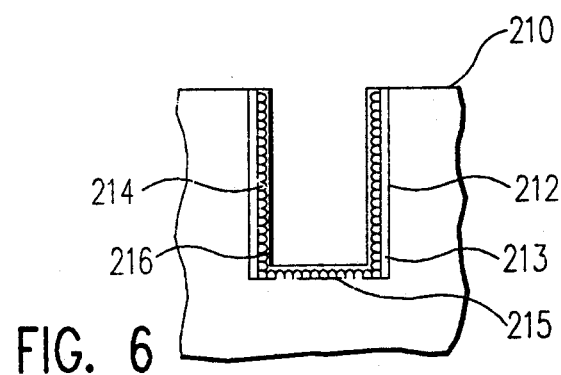

Textured polysilicon layer 214 is then formed over isolation layer 213 on the sides of the trench and on the trench bottom 215. As in the basic embodiment 100 of the invention, this textured layer may be roughened polysilicon, HSG or other equivalent material having a textured surface. The capacitor dielectric layer 216, again preferably an ONO structure, is then applied over textured layer 214, as shown in FIG. 6. The capacitor is then completed by deposit of the fill polysilicon 218, as shown in FIG. 7, planarization and the addition of electrical connections, as discussed above.

Figure 7:
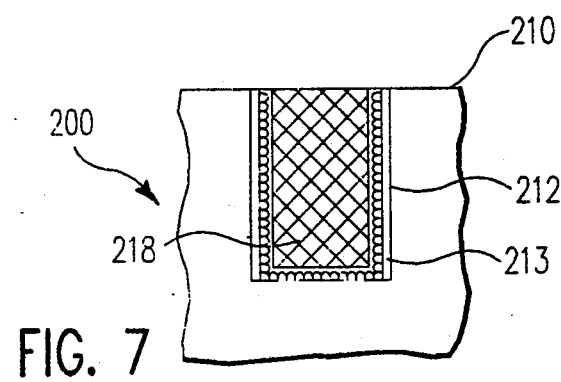

The embodiment of the invention shown in FIG. 7 is deemed preferable to the basic embodiment of FIG. 3 because of the isolation layer 213 which allows a plurality of the capacitors according to the invention to be formed at high integration density on a common substrate. It should also be noted that the embodiment of FIG. 7 can be formed with a reduced trench depth, allowing the formation of the trenches, typically by etching, and the formation of other portions of the capacitor structure to be done by processes of reduced expense and increased manufacturing yield. In any event, no increase in trench depth beyond that which can be reliably formed by known technologies is required. As pointed out above, the use of a textured capacitor electrode allows such a large increase in capacitance that a significant increase in capacitance may be obtained while reducing trench depth, employing a thicker dielectric, reducing trench opening dimensions or any combination of these design variables. This effectively allows a capacitor of improved quality and operational characteristics to be formed less expensively and at higher integration density than the prior art.

In the embodiment of FIG. 7, the entire bottom of the trench is available for substrate connection and the resistance of the capacitor is fairly low, allowing charging and discharging times to be comparable with other trench capacitor structures known in the art.

As indicated above, increased depth of known types of trench capacitors has been limited by the process complexity and trench shape. For instance, formation of various layers could be successfully done to somewhat greater depths by slightly inclining the trench walls. Such a technique is also applicable to the present invention. However, due to the extremely small size of trench capacitors and practical limitations on trench opening dimensions, the extent to which such sidewall inclination is possible is very small and the improvement in capacitance is marginal. As can be readily appreciated, inclination of the trench walls tends to increase the trench opening dimensions at the surface of substrate 210 and thus is limited by desired integration density, or vice versa. In contrast, the area of the capacitor constructed in accordance with the invention may be substantially increased by virtue of the extreme simplicity of the invention in accordance with the process and structure shown in FIGS. 8-11, as will now be explained.

Figure 8:
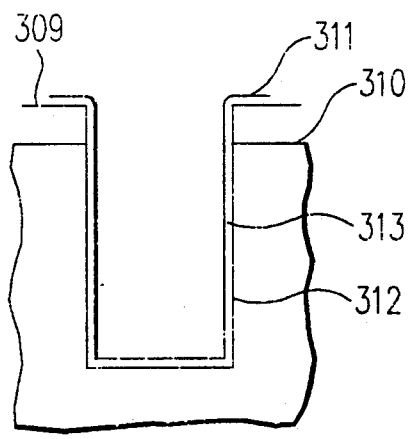
FIGS. 8, 9, 10 and 11 illustrate stages of construction of an alternative form of the capacitor of FIG. 7.
Figure 9:
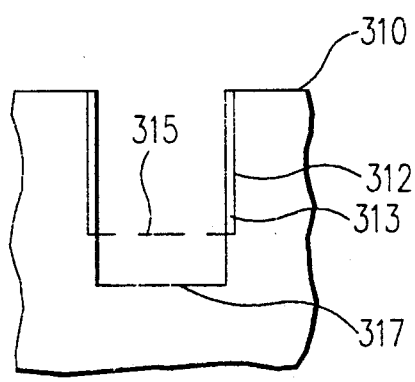

FIG. 8 is substantially identical to FIG. 4 in structure except that the depth of the trench 312 in substrate 310 is only as great as required for the formation of an adequate isolation insulator 313. This reduced trench depth allows improved isolation layer formation with potentially simplified processes and improved manufacturing yields, particularly when forming oxide layer 311. As shown in FIG. 9, the oxide layer 311 and mask 309 are removed from the substrate surface and the oxide layer 311 opened at the bottom of the trench in the same manner as in FIG. 5. However, in this case, etching is continued from the original trench bottom 315 to a generally arbitrary extended depth 317, preferably by reactive ion etching. The same etching process is preferably used for both the removal of the isolation insulator material (e.g. 213 of FIG. 4) from the bottom of the trench and the etching of the substrate to increase trench depth. As in the embodiments of FIGS. 3 and 7, the capacitor structure is completed by deposition of polysilicon fill 218, planarization and contact and/or connection formation.

Figure 10:
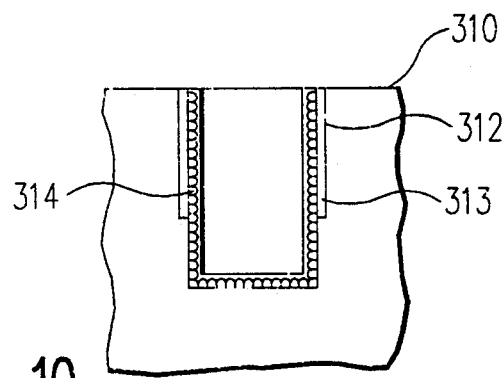

Referring now to FIG. 10, deposition of a polysilicon layer 314 is shown. This is done in a manner similar to the process in FIGS. 2 and 6 and either conventional polysilicon or HSG may be deposited. Again, if conventional polysilicon is deposited, the layer is roughened by grain boundary differential etching, preferably by use of the processes described above. It should be noted that the depth of the trench may be effectively limited by the ability to deposit this material. However, by the construction according to the invention, trench depth 317 is effectively limited only by the ability of the processes chosen to reliably form the textured polysilicon layer and to deposit the nitride layer of the ONO dielectric. It should be noted, in this regard, that the increase in capacitance due to the use of a textured capacitor electrode allows significant increase in capacitance even when trench depth is reduced, as in the embodiment shown in FIGS. 4-7. This decrease in trench depth allows less expensive processes to be used while resulting in a capacitor of improved quality. By the same token, an increase in depth of the trench need not be accompanied by an increase in trench opening dimensions or "footprint" to achieve reliable capacitor formation, allowing integration density to be maximized. Therefore, the depth to which the trench is further etched in the embodiment of FIGS. 8-11 is basically an economic choice and not limited by the capability of the present technology. However, further advances in material deposition techniques would be applicable to the invention and would allow even greater trench depth to be utilized by the designer (e.g. to improve noise margins or reduce leakage by the use of thicker capacitor dielectrics, etc.). Therefore, it is seen that capacitor structure in accordance with the present invention inherently ensures high manufacturing yields since, for the economic reasons discussed above, it is presently contemplated that trench depth is preferably limited to shallower dimensions. In any case, for a given trench depth, the capacitance of the capacitor structure in accordance with the invention will be subtantially greater than for prior art structures.

In view of the foregoing, it will be appreciated that the invention provides a capacitor structure which occupies only a small area of the surface of a substrate while having increased area and capacitance. The improvement in capacitance can be exploited to achieve improved resistance to leakage and breakdown, reduced trench depth, simplified manufacturing process steps and improved manufacturing yields. Because of the small area of the substrate occupied by a capacitor in accordance with the present invention, Storage capacities in excess of 256 Megabits may be achieved on a single chip.

While the invention has been described in terms of a basic embodiment and two alternative forms of a single preferred embodiment, those skilled in the art will recognize that the invention can be practiced with modification within the spirit and scope of the appended claims.

Having thus described my invention, what I claim as new and desire to secure by letters patent is as follows:

1. A capacitor structure formed in a trench at a surface of a substrate including an electrode having a textured surface, said electrode being formed within an inner surface of said trench wherein said electrode is formed as a layer of doped polysilicon and deposited as hemispherical grain polysilicon.

2. A capacitor structure as recited in claim 1, further including a dielectric layer formed on said textured surface.

3. A capacitor structure as recited in claim 2, wherein said dielectric layer is an oxide-nitride-oxide structure.

4. A capacitor structure as recited in claim 3, wherein said electrode is formed as a layer of doped polysilicon.

5. A capacitor structure as recited in claim 3, further including an isolation insulator layer surrounding said electrode having a textured surface.

6. A capacitor structure as recited in claim 5, wherein said trench extends to a depth within said substrate which is greater than a depth to which said isolation insulator extends.

7. A method of forming a capacitor in a trench at a surface of a substrate including the step of
forming an electrode of said capacitor within said trench, said electrode having a textured surface,
wherein said step of forming an electrode comprises a step of depositing a layer of hemispherical grain silicon within said trench.

8. A method as recited in claim 7, wherein said step of forming an electrode comprises the steps of
depositing a layer of polysilicon and
differentially etching grain boundaries at a surface of said polysilicon to form a roughened surface of said polysilicon layer.

9. A method as recited in claim 7, including a further step of depositing an isolation insulator within said trench and wherein said electrode is formed within said isolation insulator within said trench.

10. A method as recited in claim 9, wherein said step of forming an electrode comprises a step of depositing a layer of hemispherical grain silicon within said isolation insulator within said trench.

11. A method as recited in claim 9, wherein said step of forming an electrode comprises the steps of
depositing a layer of polysilicon within said isolation insulator within said trench, and
differentially etching grain boundaries at a surface of said polysilicon to form a roughened surface of said polysilicon layer.

12. A method as recited in claim 9, including the further step of
etching a bottom surface of said trench after said step of depositing an isolation insulator within said trench and prior to said step of forming said electrode of said capacitor to extend said trench beyond said isolation insulator.

13. A method as recited in claim 12, wherein said step of forming an electrode comprises a step of depositing a layer of hemispherical grain silicon within said isolation insulator within said trench.

14. A method as recited in claim 12, wherein said step of forming an electrode comprises the steps of
depositing a layer of polysilicon within said isolation insulator within said trench, and
differentially etching grain boundaries at a surface of said polysilicon to form a roughened surface of said polysilicon layer.

15. A capacitor formed in a trench of a substrate by a process including the step of
forming an electrode of said capacitor within said trench, said electrode having a textured surface,
wherein said step of forming an electrode comprises a step of depositing a layer of hemispherical grain silicon within said trench.

16. A capacitor as recited in claim 15, wherein said step of forming an electrode comprises the steps of
depositing a layer of polysilicon and
differentially etching grain boundaries at a surface of said polysilicon to form a roughened surface of said polysilicon layer.

17. A capacitor as recited in claim 15, said process including a further step of depositing an isolation insulator within said trench and wherein said electrode is formed within said isolation insulator within said trench.

18. A capacitor as recited in claim 17, wherein said step of forming an electrode comprises a step of depositing a layer of hemispherical grain silicon within said isolation insulator within said trench.

19. A capacitor as recited in claim 17, wherein said step of forming an electrode comprises the steps of
depositing a layer of polysilicon within said isolation insulator within said trench, and
differentially etching grain boundaries at a surface of said polysilicon to form a roughened surface of said polysilicon layer.

20. A method as recited in claim 17, said process including the further step of
etching a bottom surface of said trench after said step of depositing an isolation insulator within said trench and prior to said step of forming said electrode of said capacitor to extend said trench beyond said isolation insulator.

21. A method as recited in claim 20, wherein said step of forming an electrode comprises a step of depositing a layer of hemispherical grain silicon within said isolation insulator within said trench.

22. A method as recited in claim 20, wherein said step of forming an electrode comprises the steps of depositing a layer of polysilicon within said isolation insulator within said trench, and differentially etching grain boundaries at a surface of said polysilicon to form a roughened surface of said polysilicon layer.

23. A trench capacitor having an electrode thereof formed of hemispherical grain polysilicon directly deposited within an inner surface of a trench.

* * * * *